(12) United States Patent
Chai et al.

(10) Patent No.: US 10,492,325 B1
(45) Date of Patent: Nov. 26, 2019

(54) COMPUTER HOST HOUSING

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Chung Chai, New Taipei (TW); Yu-Ming Xiao, Wuhan (CN); Zan Li, Wuhan (CN); Bing Jie, Wuhan (CN)

(73) Assignees: HONGFUJIN PRECISION INDUSTRY (WUHAN) CO., LTD., Wuhan (CN); HON HAI PRECISION INDUSTRY CO., LTD., New Taipei (TW)

(*) Notice: Subject to any disclaimer, the term of this patent is extended or adjusted under 35 U.S.C. 154(b) by 0 days.

(21) Appl. No.: 16/223,419

(22) Filed: Dec. 18, 2018

(30) Foreign Application Priority Data

Aug. 28, 2018 (CN) .......................... 2018 1 0988854

(51) Int. Cl.
*H05K 7/14* (2006.01)
*H05K 5/02* (2006.01)

(52) U.S. Cl.
CPC ............ *H05K 7/1418* (2013.01); *H05K 5/02* (2013.01); *H05K 7/1487* (2013.01); *H05K 7/1489* (2013.01)

(58) Field of Classification Search
CPC .......... G06F 1/187; G06F 1/184; G06F 1/181; G11B 33/124; H05K 5/0226; H05K 7/1487; H05K 7/1489; Y10T 29/49002; Y10T 16/547
See application file for complete search history.

(56) References Cited

U.S. PATENT DOCUMENTS

| 6,388,876 | B1* | 5/2002 | Chen | G06F 1/184 |
| | | | | 312/223.2 |
| 9,229,496 | B2* | 1/2016 | Cravens | G06F 1/187 |
| 9,665,135 | B2* | 5/2017 | Wong | G06F 1/182 |
| 2005/0068720 | A1* | 3/2005 | Lambert | G06F 1/184 |
| | | | | 361/679.03 |
| 2006/0290246 | A1* | 12/2006 | Chen | G06F 1/187 |
| | | | | 312/223.2 |
| 2007/0002532 | A1* | 1/2007 | Chen | G06F 1/181 |
| | | | | 361/679.58 |
| 2011/0024592 | A1* | 2/2011 | Yu | H05K 7/1418 |
| | | | | 248/309.1 |

(Continued)

*Primary Examiner* — Abhishek M Rathod
(74) *Attorney, Agent, or Firm* — ScienBiziP, P.C.

(57) ABSTRACT

A housing of a computer host housing with a fixing for disk drives which is fastener-free includes a chassis and a magnetic rack. The chassis includes bottom shell, and first and second side shells. Ends of the first and second side shells define a first notch and a first sliding groove. The first sliding groove communicates with the first notch, the end of the first side shell defines a second notch and a second sliding groove. The second sliding groove communicates with the second notch. The magnetic rack includes first and second sidewalls. A first shaft and a second shaft protrude from the first sidewall, another first shaft protrudes from the second sidewall. The two first shafts and the second shaft can slide from the notches into the sliding grooves to secure or to allow the release of the disk drives.

18 Claims, 7 Drawing Sheets

(56) References Cited

U.S. PATENT DOCUMENTS

| | | | | |
|---|---|---|---|---|
| 2014/0375183 A1* | 12/2014 | Wang | ............... | G06F 1/181 |
| | | | | 312/223.1 |
| 2014/0375193 A1* | 12/2014 | Xiao | ............... | G06F 1/16 |
| | | | | 312/322 |
| 2015/0248147 A1* | 9/2015 | Xiao | ............... | G06F 1/187 |
| | | | | 211/26.2 |
| 2016/0109902 A1* | 4/2016 | Wang | ............... | G06F 1/181 |
| | | | | 312/223.1 |
| 2016/0116949 A1* | 4/2016 | Wang | ............... | G06F 1/181 |
| | | | | 312/223.2 |
| 2017/0086326 A1* | 3/2017 | Peng | ............... | H05K 7/16 |

* cited by examiner

COMPUTER HOST HOUSING

FIELD

The subject matter herein generally relates to a housing for a computer host.

BACKGROUND

Computer hosts include a chassis and electronic elements, such as a motherboard, a hard disk, and an optical drive device, fixed in the chassis. The hard disk and the optical drive device are fixed on a magnetic rack. The magnetic rack is screwed onto the chassis to fix the hard disk and the optical drive device in the chassis. In assembling and disassembling the hard disk or the optical drive device, the screws to be inserted or taken out, which is inconvenient and time consuming.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
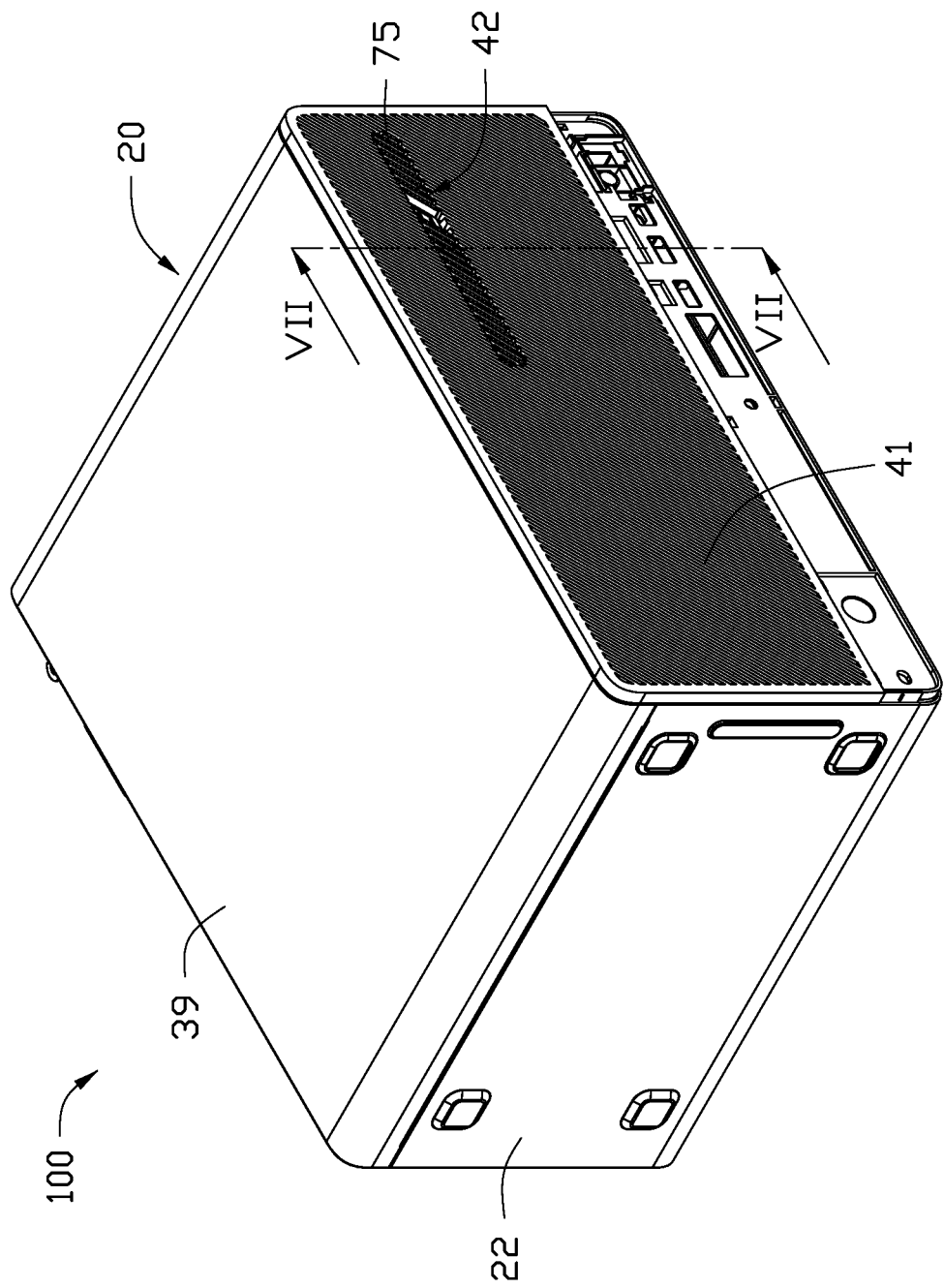
FIG. 1 is an isometric view of a computer host housing.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better show details and features of the present disclosure. The disclosure is by way of example and not by way of limitation. In the figures of the accompanying drawings, like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
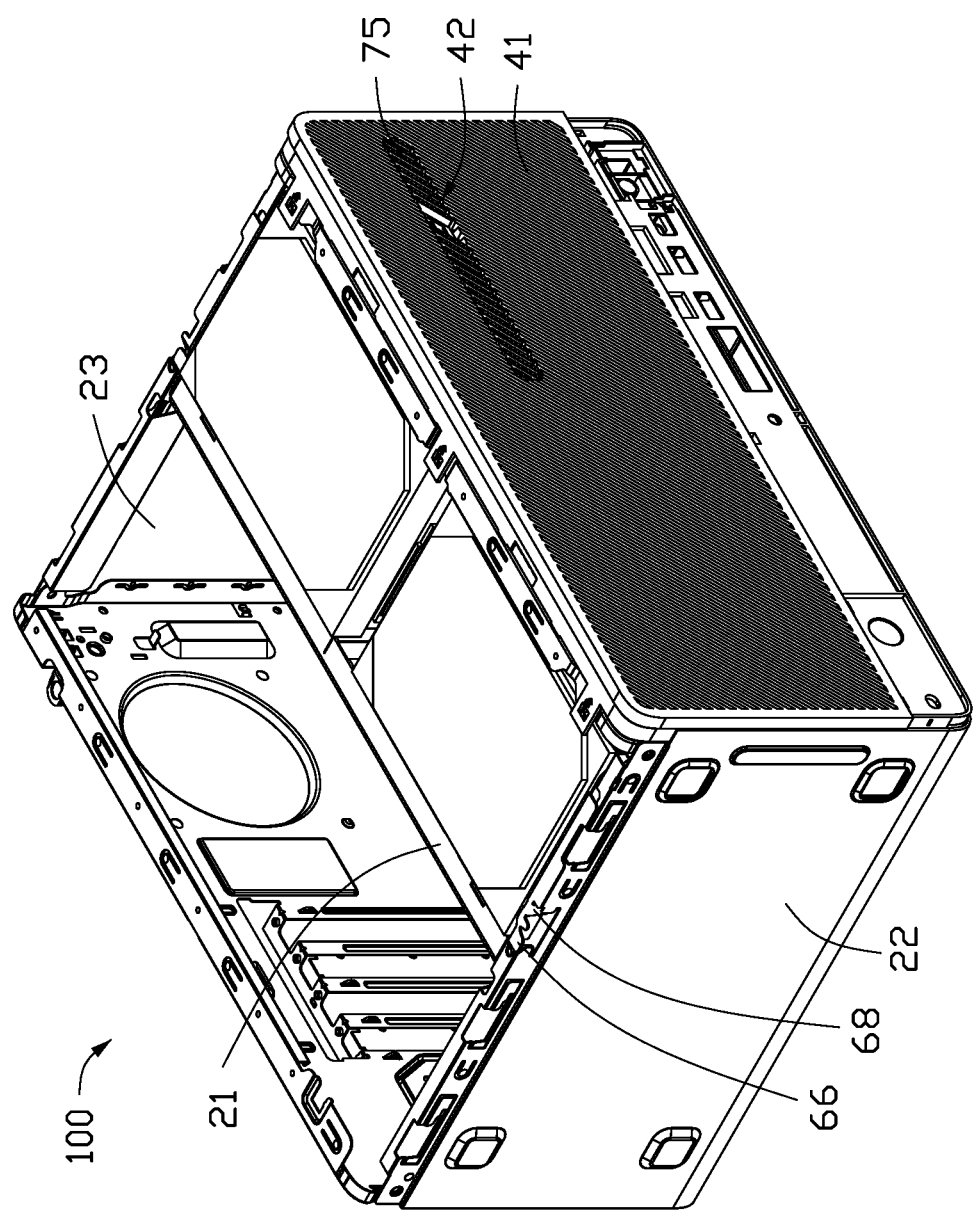
FIG. 2 is similar to FIG. 1, but with a top shell omitted.
Figure 3:
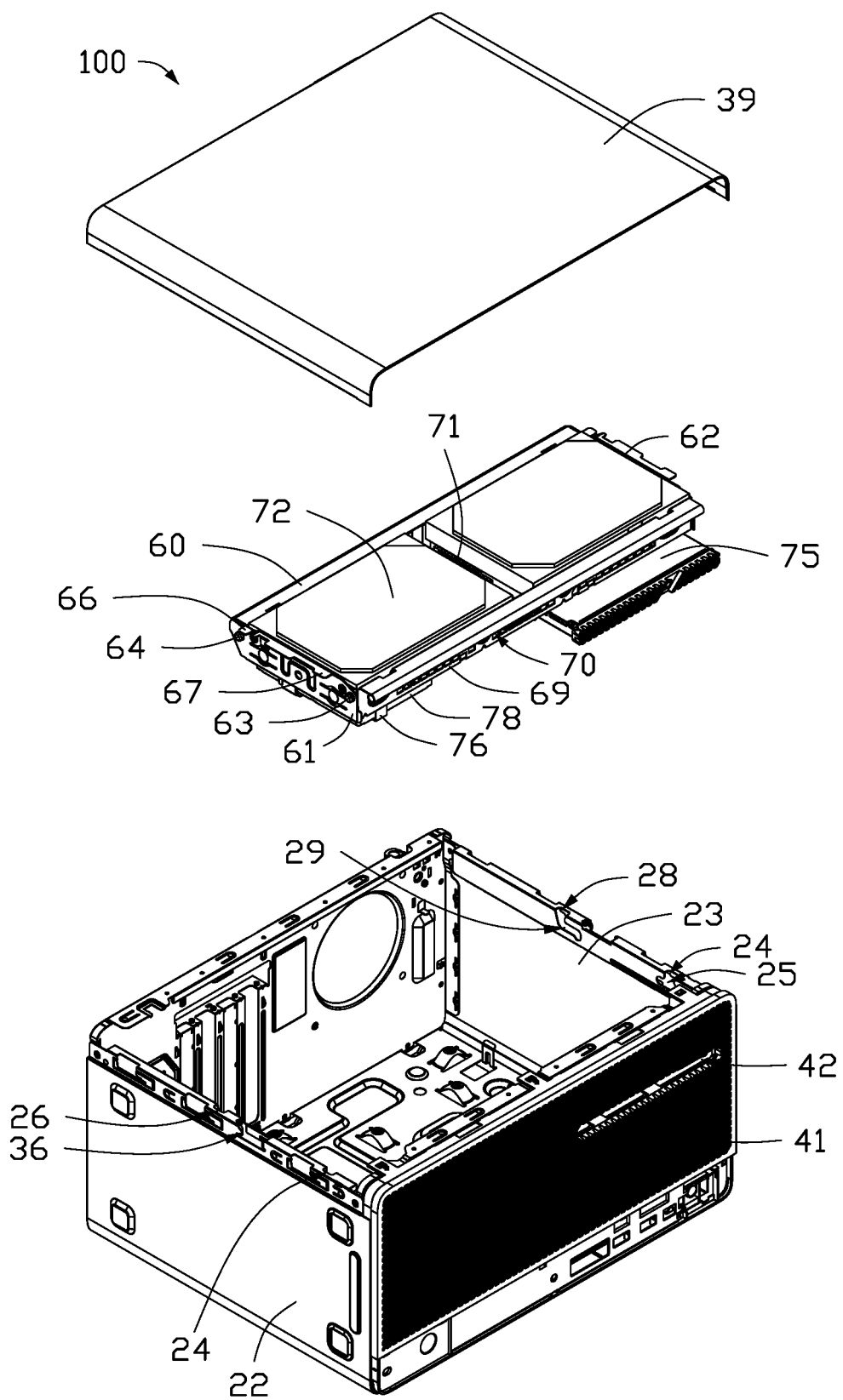
FIG. 3 is an exploded view of the computer host housing of FIG. 2.
Figure 4:
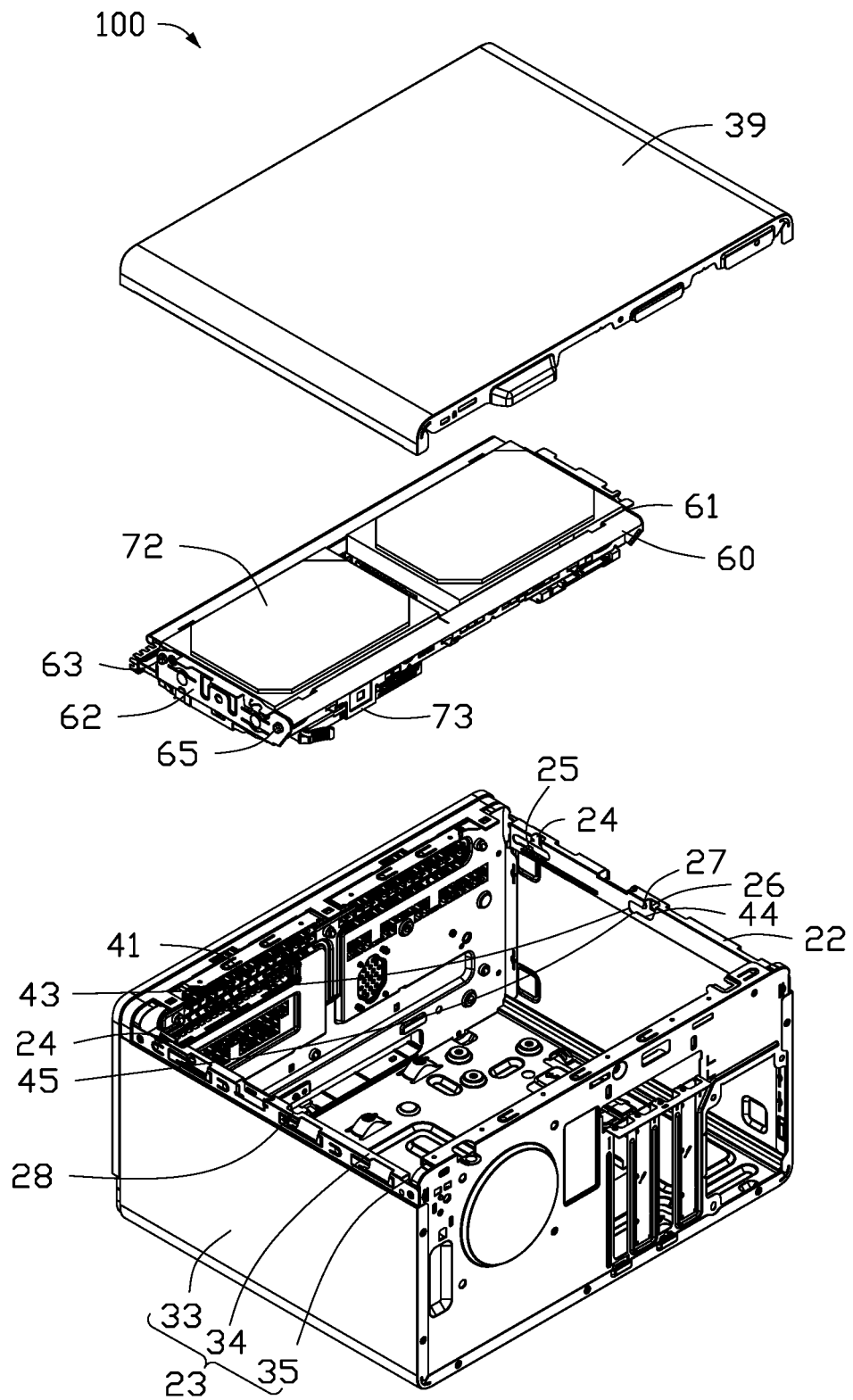
FIG. 4 is similar to FIG. 3, but viewed from a different point.
Figure 5:
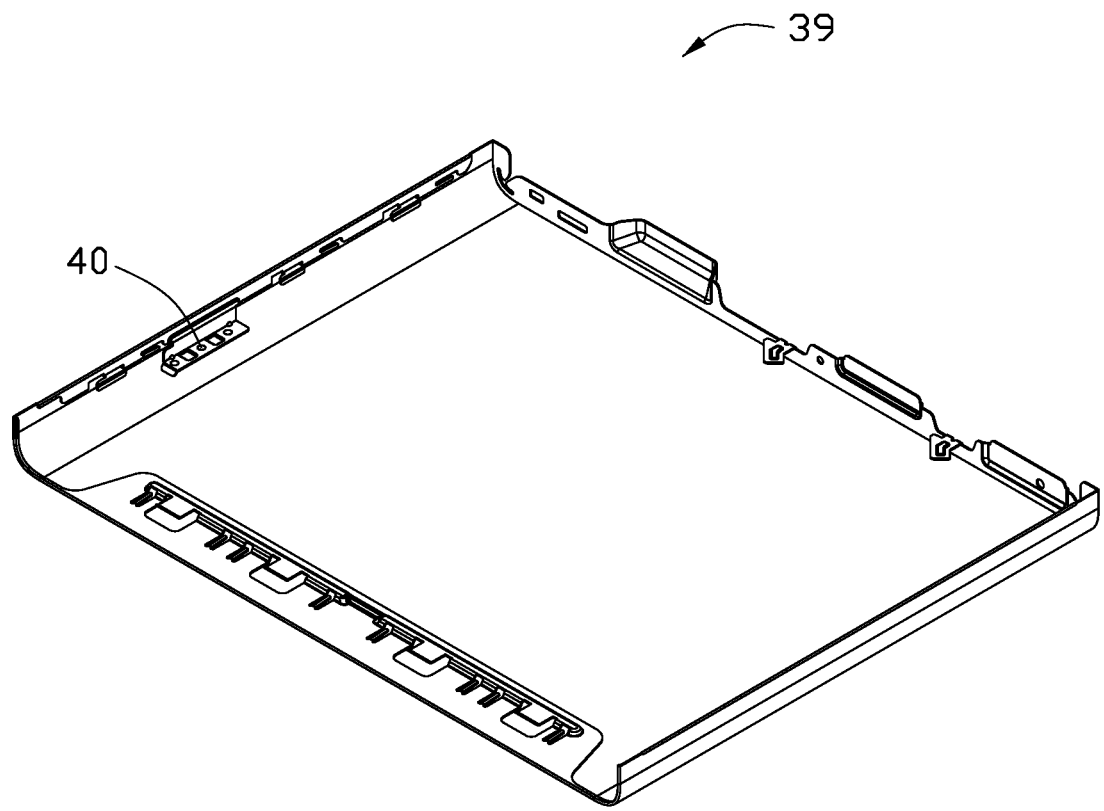
FIG. 5 is an isometric view of the top shell of the housing of FIG. 1.
Figure 6:
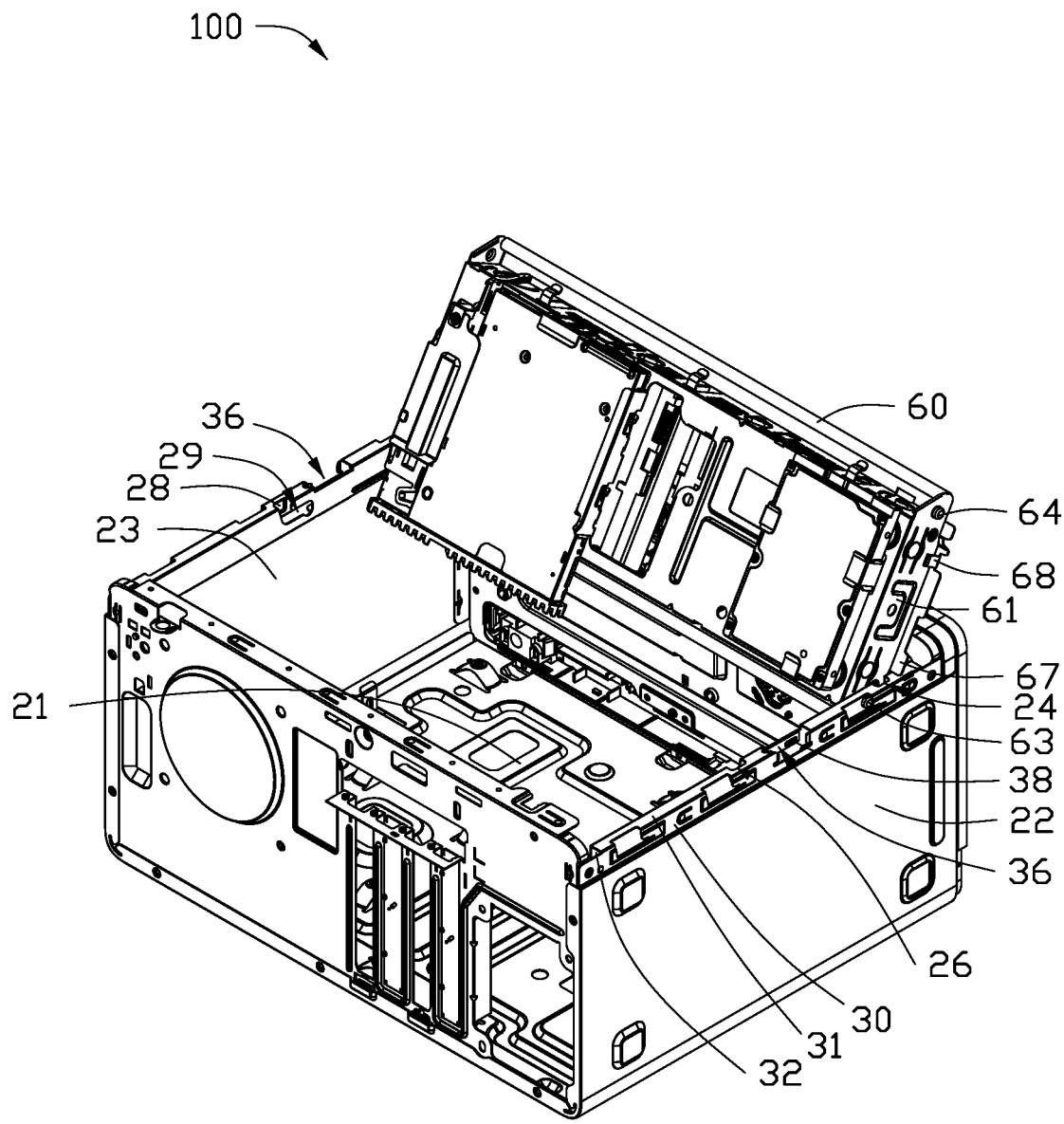
FIG. 6 is similar to FIG. 2, but with a magnetic rack rotated to a preset position.
Figure 7:
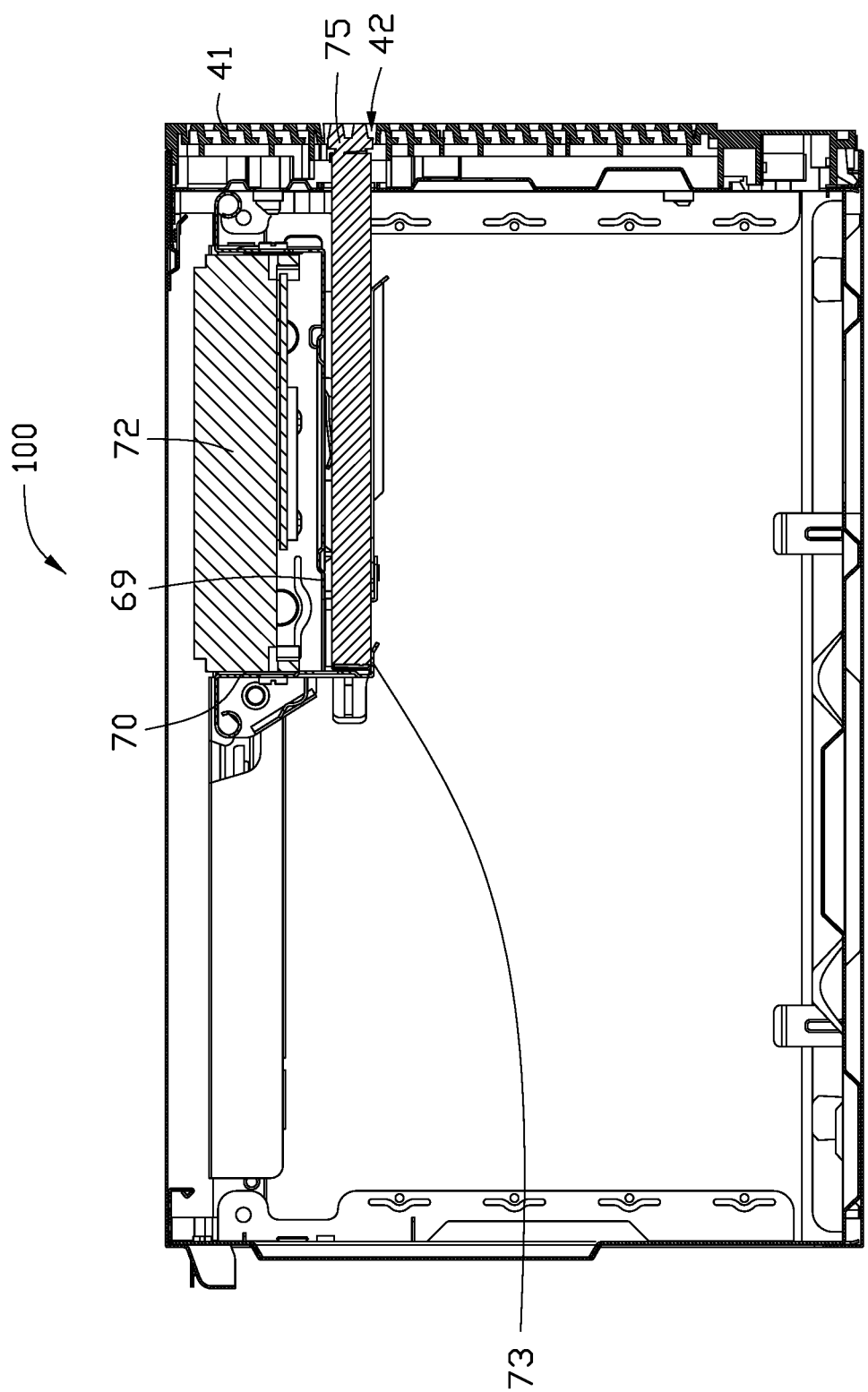
FIG. 7 is a cross-sectional view along line VII-VII of FIG. 1.

FIGS. 1 to 7 show a computer host housing 100. The computer host housing 100 includes a chassis 20 and a magnetic rack 60. The chassis 20 includes a bottom shell 21, a first side shell 22, and a second side shell 23. The first side shell 22 and the second side shell 23 are fixed to the bottom shell 21 opposite to each other. Ends of the first side shell 22 and the second side shell 23 away from the bottom shell 21 respectively define a first notch 24 and a first sliding groove 25. The first sliding groove 25 communicates with the first notch 24 and is angled in a first direction. The end of the first side shell 22 away from the bottom shell 21 further defines a second notch 26 and a second sliding groove 27. The second sliding groove 27 communicates with the second notch 26 and is angled in the first direction. The magnetic rack 60 includes a first sidewall 61 and a second sidewall 62 opposite to the first sidewall 61. The first sidewall 61 and the second sidewall 62 are disposed between the first side shell 22 and the second side shell 23. Two first shafts 63 protrude from opposite sides of the first sidewall 61 and the second sidewall 62. A second shaft 64 protrudes from the first sidewall 61. The two first shafts 63 and the second shaft 64 slide from the two first notches 24 and the second notches 26 into the first sliding groove 25 and the second sliding groove 27.

The end of the second side shell 23 away from the bottom shell 21 further defines a third notch 28 and a third sliding groove 29. The third sliding groove 29 communicates with the third notch 26 and is angled in the first direction. A third shaft 65 protrudes from the second sidewall 62. When the two first shafts 63 and the second shaft 64 slide from the two first notches 24 and the second notches 26 into the two first sliding grooves 25 and the second sliding grooves 27, the third shaft 65 slides from the third notch 28 into the third sliding groove 29.

The first side shell 22 is parallel to the second side shell 23. The first sidewall 61 and the second sidewall 62 are parallel to the first side shell 22. The two first shafts 63 are aligned with each other and are perpendicular to the first side wall 61. The second shaft 64 is aligned with the third shaft 65 and perpendicular to the first sidewall 61. When the two first shafts 63, the second shaft 64, and the third shaft 65 are disposed at the first notch 24, the second notch 26, and the third notch 28, the magnetic rack 60 is rotatable around the first shaft 63 above the first side shell 22.

The magnetic rack 60 further includes two positioning members 67 extending away from the first side wall 61 and the second side wall 62. One of the two positioning members 67 is located between one of the two first shafts 63 and the second shaft 64. The other positioning member 67 is located between the other first shaft 63 and the third shaft 65. When the magnetic rack 60 rotates around the first shafts 63 above the first side shell 22 to a preset position, the two first shafts 63 abut edges of the two first sliding grooves 25 and the two positioning members 67 abut the first side shell 22 and the second side shell 23. In such preset position, the center of gravity of the magnetic rack 60 is located on a side of the first shaft 63 away from the second shaft 64, thereby the magnetic rack 60 keeps above the first side shell 22.

The first side shell 22 includes a first fixing plate 30, a first restricting piece 31, and a first positioning piece 32. The first restricting piece 31 is angled from an end of the first fixing plate 30 away from the bottom shell 21 toward the second side shell 23. The first positioning piece 32 is angled from an end of the first restricting piece 31 away from the first fixing plate 30 toward the bottom shell 21. One of the first notches 24 and the second notch 26 are formed on the first restricting piece 31. One of two first sliding grooves 25 and the second sliding groove 27 are formed on the first positioning piece 32.

The second side shell 23 includes a second fixing plate 33, a second restricting piece 34, and a second positioning piece 35. The second restricting piece 34 is angled from an end of the second fixing plate 33 away from the bottom shell 21 toward the first side shell 22. The second positioning piece 35 is angled from an end of the second restricting piece 34 away from the second fixing plate 33 toward the bottom shell 21. The other first notch 24 and the third notch 28 are formed on the second restricting piece 34. The other first sliding groove 25 and the third sliding groove 29 are formed on the second positioning piece 35.

The first side shell 22 and the second side shell 23 each define a recessed groove 36. The magnetic rack 60 further includes two restricting members 66 extending away from the first sidewall 61 and the second sidewall 62. When the two first shafts 63, the second shaft 64, and the third shaft 65 are disposed at ends of the first sliding groove 25, the second sliding groove 27, and the third sliding groove 29, the two restricting members 66 are disposed in the two recessed grooves 36 and abut against the first side shell 22 and the second side shell 23 respectively, to prevent the magnetic rack 60 from moving in a direction parallel to the first side shell 22.

The magnetic rack 60 further includes two elastic pieces 68 extending away from the first sidewall 61 and the second sidewall 62. Two protrusions 38 protrude from the first positioning piece 32 and the second positioning piece 35. When the two first shafts 63, the second shaft 64, and the third shaft 65 are disposed at the ends of the first sliding groove 25, the second sliding groove 27, and the third sliding groove 29, the two elastic pieces 68 abut the two protrusions 38. The first positioning piece 32 is clamped between the first sidewall 61 and one of the two elastic pieces 68, and the second positioning piece 35 is clamped between the second sidewall 61 and the other elastic piece 68. Thus, the magnetic frame 60 is prevented from moving in a direction perpendicular to the first side shell 22.

The chassis 20 further includes a top shell 39. The top shell 39 is fixed between the first side shell 22 and the second side shell 23. The top shell 39 includes a number of protruding portions 40 facing the bottom shell 21. The protruding portion 40 abuts the restricting member 66 to prevent the magnetic rack 60 from moving in a direction perpendicular to the bottom shell 21.

The chassis 20 further includes a front plate 41 connected between the first side shell 22 and the second side shell 23. The front plate 41 defines a through hole 42. The magnetic rack 60 further includes a bottom plate 69 and two third sidewalls 70. The two third sidewalls 70 connect the two ends of the first sidewall 61 and the two ends of the second sidewall 62. The bottom plate 69 connects the first sidewall 61, the second sidewall 62, and the bottom plate 69 to form a receiving area 71. The receiving area 71 receives first storage device 72 at least. The first storage device 72 is a 3.5-inch hard disk. The magnetic rack 60 further includes a first bracket 73 fixed to a side of the bottom plate 69 facing the bottom shell 21. An optical drive device 75 is fixed to the first bracket 73. The optical drive device 75 extends from the third sidewall 70. When the two first shafts 63, the second shaft 64, and the third shaft 65 are disposed at the ends of the two first sliding grooves 25, the second sliding grooves 27, and the third sliding grooves 29, the optical drive device 75 is positioned in the through hole 42. The magnetic rack 60 further includes a second bracket 76 fixed to a side of the bottom plate 69 toward the bottom shell 21. A second storage device 78 is secured to the second bracket 76. The second storage device 78 can be a 2.5 inch hard disk for example.

Sides of the second sliding groove 27 and the third sliding groove 29 adjacent to the bottom shell 21 include a first sliding edge 43, a second sliding edge 44, and a connection edge 45 connected between the first sliding edge 43 and the second sliding edge 44. The first sliding edge 43 is closer to the bottom shell 21 and the front plate 41 than to the second sliding edge 44. Thus, when the two first shafts 63 slide from the two first sliding grooves 25 to the two first notches 24, the second shaft 64 and the third shaft 65 slide along the connection edge 45 to move away the bottom shell 21. When the optical drive device 75 is offset to disengage from the through hole 42, there is a sufficient clearance between opposite sides of the through hole 42 so that the optical drive device 75 does not interfere with the edge of the through hole 42.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A computer host housing comprising:
   a chassis comprising a bottom shell, a first side shell and a second side shell opposite to the first side shell, each of the first side shell and the second side shell being fixed to the bottom shell, ends of the first side shell and the second side shell away from the bottom shell respectively defining a first notch and a first sliding groove communicating with the first notch, the first sliding groove being bent in a first direction, the end of the first side shell away from the bottom shell further defining a second notch and a second sliding groove communicating with the second notch, the second sliding groove is bent in the first direction;
   a magnetic rack comprising a first sidewall and a second sidewall opposite to the first sidewall, the first sidewall and the second sidewall being disposed between the first side shell and the second side shell;
   two first shafts protruded from opposite sides of the first sidewall and the second sidewall; and
   a second shaft protruded from the first sidewall, the two first shafts and the second shaft sliding from the two first notches and the second notches into the first sliding groove and the second sliding groove correspondingly;
   wherein the chassis further comprises a front plate connected between the first side shell and
   the second side shell, the front plate defines a through hole, an optical drive device is fixed to the magnetic rack, the optical drive device extends from a third sidewall of the magnetic rack, when the two first shafts, the second shaft, and the third shaft are respectively disposed at the ends of the two first sliding grooves, the second sliding grooves, and the third sliding grooves, the optical drive device is positioned in the through hole, sides of the second sliding groove and the third sliding groove adjacent to the bottom shell comprise a first sliding edge, a second sliding edge, and a connection edge connected between the first sliding edge and the second sliding edge, the first sliding edge is closer to the bottom shell and the front plate than the second sliding edge.

2. The computer host housing of claim 1, wherein the end of the second side shell away from the bottom shell further defines a third notch and a third sliding groove, the third sliding groove communicates with the third notch and is bent in the first direction, a third shaft is protruded from the second sidewall, when the two first shafts and the second shaft are slid from the two first notches and the second notches into the two first sliding grooves and the second sliding grooves, the third shaft slides from the third notch into the third sliding groove.

3. The computer host housing of claim 2, wherein the first side shell is parallel to the second side shell, the first sidewall and the second sidewall are parallel to the first side shell, the two first shafts are aligned with each other and perpendicular to the first side wall, the second shaft is aligned with the third shaft and perpendicular to the first sidewall, when the two first shafts, the second shaft, and the third shaft are respectively disposed at the first notch, the second notch, and the third notch, the magnetic rack is rotatable around the first shaft above the first side shell.

4. The computer host housing of claim 3, wherein the magnetic rack further comprises two positioning members each extending away from the first side wall and the second side wall, when the magnetic rack rotates around the first shafts above the first side shell to a preset position, the two first shafts abut against edges of the two first sliding grooves and the two positioning members abut against the first side shell and the second side shell.

5. The computer host housing of claim 2, wherein the first side shell comprises a first fixing plate, a first restricting piece and a first positioning piece, the first restricting piece is bent from an end of the first fixing plate away from the bottom shell toward the second side shell, the first positioning piece is bent from an end of the first restricting piece away from the first fixing plate toward the bottom shell, one of the two first notches and the second notch are formed on the first restricting piece, one of the two first sliding grooves and the second sliding groove are formed on the first positioning piece.

6. The computer host housing of claim 5, wherein the second side shell comprises a second fixing plate, a second restricting piece and a second positioning piece, the second restricting piece is bent from an end of the second fixing plate away from the bottom shell toward the first side shell, the second positioning piece is bent from an end of the second restricting piece away from the second fixing plate toward the bottom shell, the other first notch and the third notch are formed on the second restricting piece, the other first sliding groove and the third sliding groove are formed on the second positioning piece.

7. The computer host housing of claim 6, wherein the magnetic rack further comprises two elastic pieces extending away from the first sidewall and the second sidewall, two protrusions are protruded from the first positioning piece and the second positioning piece, when the two first shafts, the second shaft, and the third shaft are disposed at the ends of the first sliding groove, the second sliding groove, and the third sliding groove, the two elastic pieces abut against the two protrusions, and the first positioning piece is clamped between the first sidewall and one of the two elastic pieces, the second positioning piece is clamped between the second sidewall and another one of the two elastic pieces.

8. The computer host housing of claim 7, wherein the chassis further comprises a top shell, the top shell is fixed between the first side shell and the second side shell, the top shell comprises a plurality of protruding portions facing the bottom shell, the protruding portion abuts against the restricting member.

9. The computer host housing of claim 2, wherein the first side shell and the second side shell respectively defines a recessed groove, the magnetic rack further comprises two restricting members respectively extending away from the first sidewall and the second sidewall, when the two first shafts, the second shaft, and the third shaft are respectively disposed at ends of the first sliding groove, the second sliding groove, and the third sliding groove, the two restricting members are disposed in the two recessed grooves and abut against the first side shell and the second side shell.

10. A computer host housing comprising:
a chassis comprising a bottom shell, a first side shell and a second side shell parallel to the first side shell, each of the first side shell and the second side shell extending from the bottom shell, the first side shell and the second side shell away from the bottom shell respectively defining a first notch and a first sliding groove communicating with the first notch, the first sliding groove being bent in a first direction, the first side shell further defining a second notch and a second sliding groove communicating with the second notch, the second sliding groove is bent in the first direction;
a magnetic rack comprising a first sidewall and a second sidewall opposite to the first sidewall, the first sidewall and the second sidewall being disposed between the first side shell and the second side shell;
two first shafts protruded from opposite sides of the first sidewall and the second sidewall; and
a second shaft protruded from the first sidewall, the two first shafts and the second shaft sliding from the two first notches and the second notches into the first sliding groove and the second sliding groove correspondingly;
wherein the chassis further comprises a front plate connected between the first side shell and the second side shell, the front plate defines a through hole, an optical drive device is fixed to the magnetic rack, the optical drive device extends from a third sidewall of the magnetic rack, when the two first shafts, the second shaft, and the third shaft are respectively disposed at the ends of the two first sliding grooves, the second sliding grooves, and the third sliding grooves, the optical drive device is positioned in the through hole, sides of the second sliding groove and the third sliding groove adjacent to the bottom shell comprise a first sliding edge, a second sliding edge, and a connection edge connected between the first sliding edge and the second sliding edge, the first sliding edge is closer to the bottom shell and the front plate than the second sliding edge.

11. The computer host housing of claim 10, wherein the end of the second side shell away from the bottom shell further defines a third notch and a third sliding groove, the third sliding groove communicates with the third notch and is bent in the first direction, a third shaft is protruded from the second sidewall, when the two first shafts and the second shaft are slid from the two first notches and the second notches into the two first sliding grooves and the second sliding grooves, the third shaft slides from the third notch into the third sliding groove.

12. The computer host housing of claim 11, wherein the first side shell is parallel to the second side shell, the first sidewall and the second sidewall are parallel to the first side shell, the two first shafts are aligned with each other and perpendicular to the first side wall, the second shaft is aligned with the third shaft and perpendicular to the first sidewall, when the two first shafts, the second shaft, and the third shaft are respectively disposed at the first notch, the second notch and the third notch, the magnetic rack is rotatable around the first shaft above the first side shell.

13. The computer host housing of claim 12, wherein the magnetic rack further comprises two positioning members each extending away from the first side wall and the second side wall, when the magnetic rack rotates around the first shafts above the first side shell to a preset position, the two first shafts abut against edges of the two first sliding grooves and the two positioning members abut against the first side shell and the second side shell.

14. The computer host housing of claim 11, wherein the first side shell comprises a first fixing plate, a first restricting piece and a first positioning piece, the first restricting piece is bent from an end of the first fixing plate away from the bottom shell toward the second side shell, the first positioning piece is bent from an end of the first restricting piece away from the first fixing plate toward the bottom shell, one of the two first notches and the second notch are formed on the first restricting piece, one of the two first sliding grooves and the second sliding groove are formed on the first positioning piece.

15. The computer host housing of claim 14, wherein the second side shell comprises a second fixing plate, a second restricting piece and a second positioning piece, the second restricting piece is bent from an end of the second fixing plate away from the bottom shell toward the first side shell, the second positioning piece is bent from an end of the second restricting piece away from the second fixing plate toward the bottom shell, the other first notch and the third notch are formed on the second restricting piece, the other first sliding groove and the third sliding groove are formed on the second positioning piece.

16. The computer host housing of claim 15, wherein the magnetic rack further comprises two elastic pieces extending away from the first sidewall and the second sidewall, two protrusions are protruded from the first positioning piece and the second positioning piece, when the two first shafts, the second shaft, and the third shaft are disposed at the ends of the first sliding groove, the second sliding groove, and the third sliding groove, the two elastic pieces abut against the two protrusions, and the first positioning piece is clamped between the first sidewall and one of the two elastic pieces, the second positioning piece is clamped between the second sidewall and another one of the two elastic pieces.

17. The computer host housing of claim 16, wherein the chassis further comprises a top shell, the top shell is fixed between the first side shell and the second side shell, the top shell comprises a plurality of protruding portions facing the bottom shell, the protruding portion abuts against the restricting member.

18. The computer host housing of claim 11, wherein the first side shell and the second side shell define a recessed groove, the magnetic rack further comprises two restricting members extending away respectively from the first sidewall and the second sidewall, when the two first shafts, the second shaft, and the third shaft are respectively disposed at ends of the first sliding groove, the second sliding groove, and the third sliding groove, the two restricting members are disposed in the two recessed grooves and abut against the first side shell and the second side shell.

* * * * *